United States Patent
Hirai et al.

(10) Patent No.: US 10,074,511 B2
(45) Date of Patent: Sep. 11, 2018

(54) DEFECT IMAGE CLASSIFICATION APPARATUS

(71) Applicant: Hitachi High-Technologies Corporation, Minato-ku, Tokyo (JP)

(72) Inventors: Takehiro Hirai, Tokyo (JP); Yohei Minekawa, Tokyo (JP); Yutaka Tandai, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 15/163,725

(22) Filed: May 25, 2016

(65) Prior Publication Data
US 2016/0358746 A1 Dec. 8, 2016

(30) Foreign Application Priority Data
Jun. 5, 2015 (JP) ................. 2015-114689

(51) Int. Cl.
H01J 37/00 (2006.01)
H01J 37/22 (2006.01)
H01J 37/285 (2006.01)
H01J 37/28 (2006.01)

(52) U.S. Cl.
CPC ............ *H01J 37/222* (2013.01); *H01J 37/28* (2013.01); *H01J 37/285* (2013.01); *H01J 2237/221* (2013.01); *H01J 2237/24592* (2013.01)

(58) Field of Classification Search
CPC ........ H01J 37/222; H01J 37/28; H01J 37/285; H01J 2237/221; H01J 2237/24592
USPC ......................... 250/306, 307, 310
See application file for complete search history.

(56) References Cited

U.S. PATENT DOCUMENTS

2013/0222574 A1 8/2013 Nakagaki et al.

FOREIGN PATENT DOCUMENTS

JP 2012-83147 A 4/2012

*Primary Examiner* — Nicole Ippolito
*Assistant Examiner* — Hanway Chang
(74) *Attorney, Agent, or Firm* — Crowell & Moring LLP

(57) ABSTRACT

A defect image classification apparatus includes a control unit that selects images obtained from at least some detectors among a plurality of detectors, associated with kinds of defects to be a classification result of an automatic defect classification processing unit, as images displayed initially on a display unit. The control unit associates the kinds of the defects and the images displayed initially on the display unit, on the basis of a switching operation log when a user classifies images of defects determined previously as the same kinds as the kinds of the defects determined by the automatic defect classification processing unit.

9 Claims, 11 Drawing Sheets

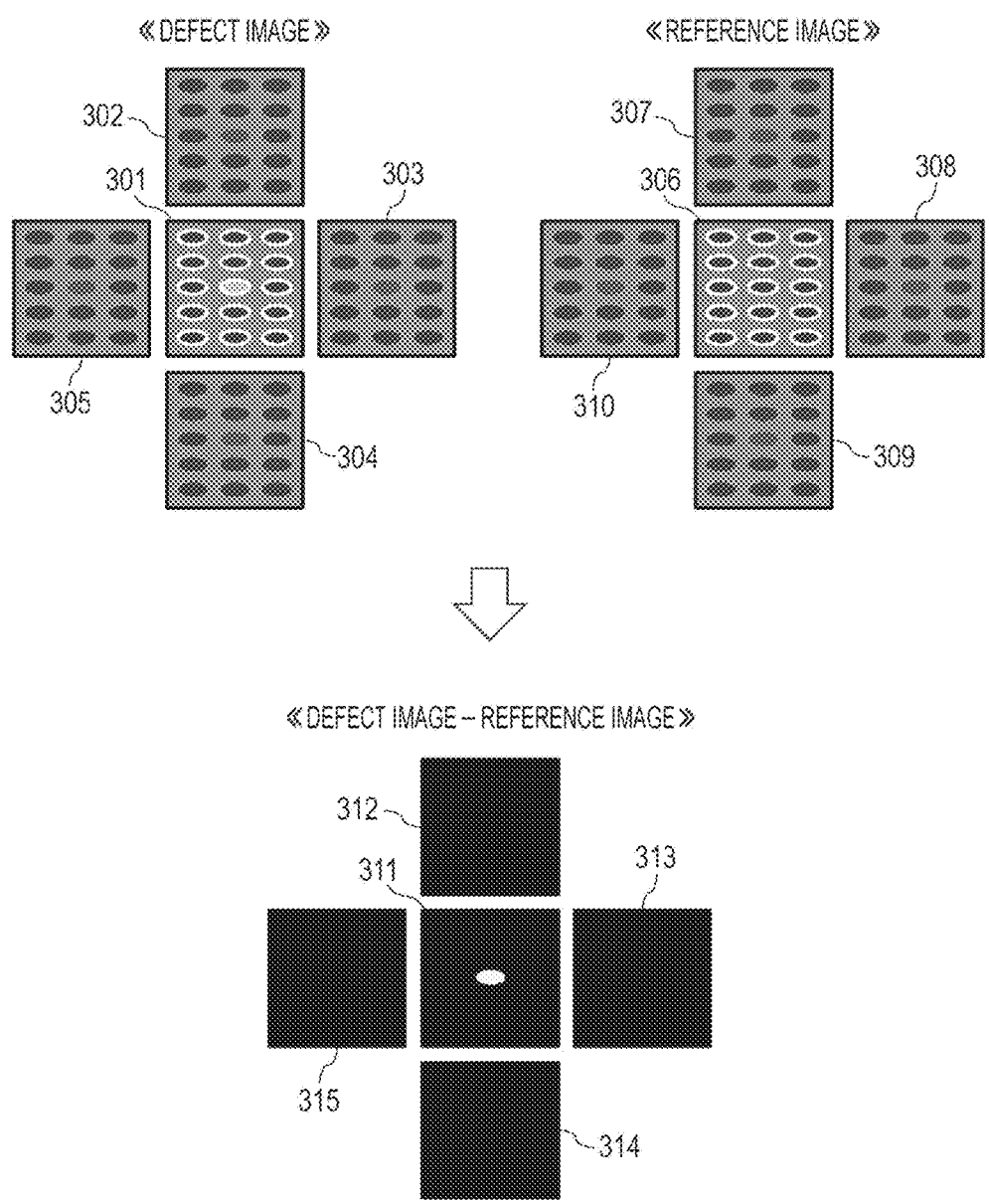

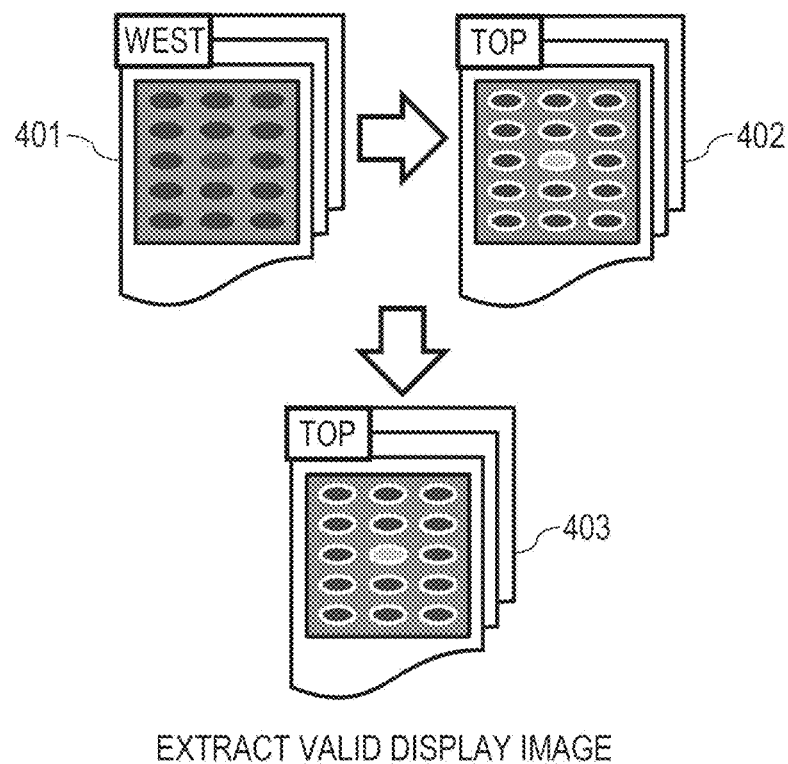

FIG. 8
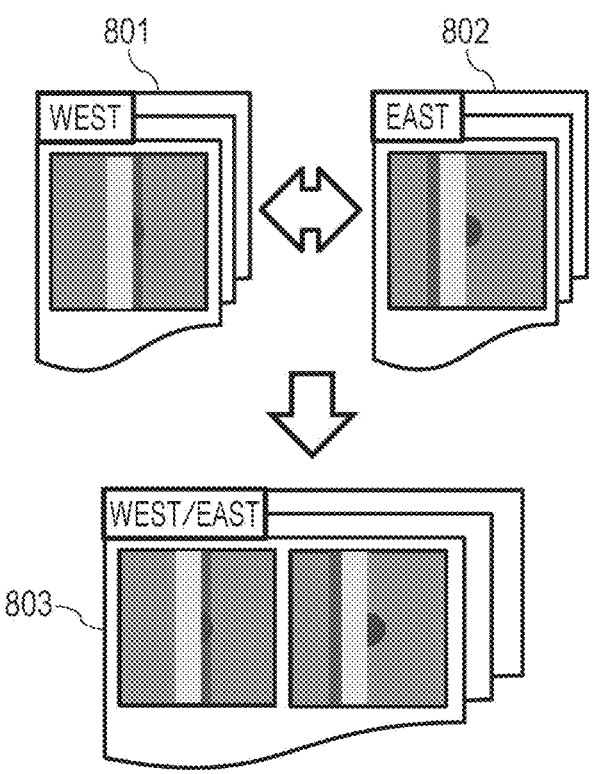
EXTRACT A PLURALITY OF VALID IMAGE KINDS
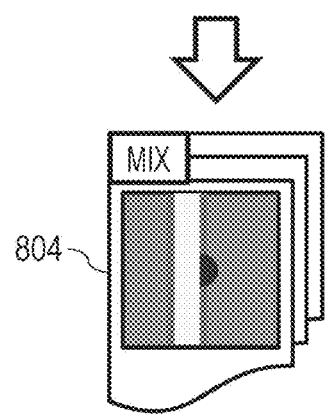
COMBINE A PLURALITY OF KINDS OF IMAGES

DEFECT IMAGE CLASSIFICATION APPARATUS

CLAIM OF PRIORITY

The present application claims priority from Japanese patent application JP 2015-114689 filed on Jun. 5, 2015, the content of which is hereby incorporated by reference into this application.

BACKGROUND OF THE INVENTION

1. Field of the Invention

The present invention relates to a defect image classification apparatus.

2. Description of the Related Art

In a semiconductor manufacturing process, to secure a high yield, it is important to discover a defect occurring in the manufacturing process early and take measures. A scanning electron microscope (SEM)-type defect observation device is a device to observe a defect occurred in the semiconductor manufacturing process, particularly. The SEM-type defect observation device is generally a device to observe an image of the defect coordinates detected by an upper (upstream side) defect inspection device with definition higher than definition of the upper defect inspection device. The upper defect inspection device is an optical defect inspection device, for example.

A specific flow in the SEM-type defect observation device will be described. The SEM-type defect observation device first moves a sample stage to the defect coordinates output by the upper defect inspection device and executes imaging with a low magnification of a degree where a defect to be observed enters a view. Next, the SEM-type defect observation device detects the defect coordinates from an imaged low-magnification image, moves the sample stage such that the defect is positioned at the center of the view or moves the center of the imaging, and acquires a high-magnification image for observation with the high magnification suitable for the defect observation. As such, the defect coordinates are detected from the low-magnification image before the high-magnification image for the observation is acquired, because an error is included in the defect coordinates output by the upper defect inspection device in a range of a device specification and processing for correcting the error is necessary when a high-definition defect image is acquired by the SEM-type defect observation device. Automating a process for acquiring the high-definition defect image (high-magnification image) is automatic defect review or automatic defect redetection (ADR).

Defect images acquired by the ADR or manually are classified for each kind of defects and are managed. Automating defect classification work is automatic defect classification (ADC). Different from the ADC, work for classifying the defect images manually is called manual defect classification (MDC). Classification performance of the ADC is improved. However, because the ADC cannot classify a wide variety of defects completely, the ADC is used together with the MDC in a large number of processes. Specifically, depending on the classification performance of the ADC, a classification result of the ADC is applied without a modification with respect to kinds of defects for which the classification performance of the ADC is sufficient, but work for confirming the classification result of the ADC by the MDC is performed with respect to kinds of defects for which the classification performance of the ADC is insufficient. When the confirmation work is performed by the MDC, a kind of a defect is specified by comparing a plurality of defect images existing with respect to one defect, for example, the low-magnification defect image, the high-magnification defect image, and a plurality of kinds of images detected by a plurality of detectors according to optical characteristics.

Meanwhile, JP-2012-83147-A discloses "a left image or a right image obtained by detecting backward scattered electrons in which it is easy to confirm an uneven situation is displayed when a classification result is a foreign material having a surface of a convex shape".

SUMMARY OF THE INVENTION

Recently, with miniaturization of a design pattern and complexity of a manufacturing process, defects affecting the yield are diversified. To realize improvement of the yield, work for acquiring a large amount of defect images and classifying the acquired defect images for each kind of the defects is necessary and improvement of efficiency of the image acquisition and classification work is required. For the image acquisition, the automation by the ADR is realized. However, in the classification work for a large amount of images acquired automatically by the ADR, perfect automation by the ADC is not realized and the ADC is generally used together with the MDC. When the ADC and the MDC are used together, work for modifying the ADC result by the MDC is performed. When the modification work is performed, it is important to display a defect image suitable for the MDC work, specifically, an image best showing a feature of the defect.

In a method disclosed in JP-2012-83147-A, the displayed image can be switched displayed according to the kind of the defect. However, appropriate image display depends on calculation of a feature amount of the defect and analysis performance of the ADC. When an appropriate image is not displayed, efficiency of the MDC work is deteriorated.

An object of the present invention is to improve efficiency of MDC work by selectively displaying an image suitable for specifying a defect kind initially.

According to the present invention, efficiency of MDC work can be improved by selectively displaying an image suitable for specifying a defect kind initially.

For example, in order to solve the problem, the configuration described within the scope of the claims is adopted. This application includes solutions to the problem, and in an example, there is provided a defect image classification apparatus including: an image acquisition unit which acquires images corresponding to a plurality of detectors, on the basis of signals obtained by detecting secondary particles obtained by emitting charged particle beams to a sample by the plurality of detectors; an automatic defect classification processing unit which automatically classifies kinds of defects included in the images, on the basis of the images; a display unit which displays the automatically classified kinds of the defects and images used for the automatic classification; a manual defect classification processing unit which classifies the kinds of the defects included in the images, according to an instruction input by a user, and modifies an automatic classification result; a control unit which selects images obtained from at least some detectors among the plurality of detectors, associated with the kinds of the defects to be the classification result of the automatic defect classification processing unit, as images displayed initially on the display unit when the instruction is input by the user; and an image switching instruction input unit which receives an input of the user showing switching the images displayed on the display unit into images obtained by other detectors at the same time as acquisition of the images, wherein the control unit associates the kinds of the defects and the images displayed initially on the display unit, on the basis of a switching operation log of the user for the image switching instruction input unit when the user classifies images of defects determined previously as the same kinds as the kinds of the defects determined by the automatic defect classification processing unit.

BRIEF DESCRIPTION OF THE DRAWINGS

FIG. 3 is a schematic diagram illustrating a basic concept of defect detection processing in ADR;

FIG. 4 is a schematic diagram illustrating a basic concept of extracting a display image at the time of determining a defect kind in MDC;

FIG. 8 is a schematic diagram illustrating a basic concept of extracting a display image at the time of determining a defect kind in the MDC;

DESCRIPTION OF THE PREFERRED EMBODIMENTS

Figure 1:
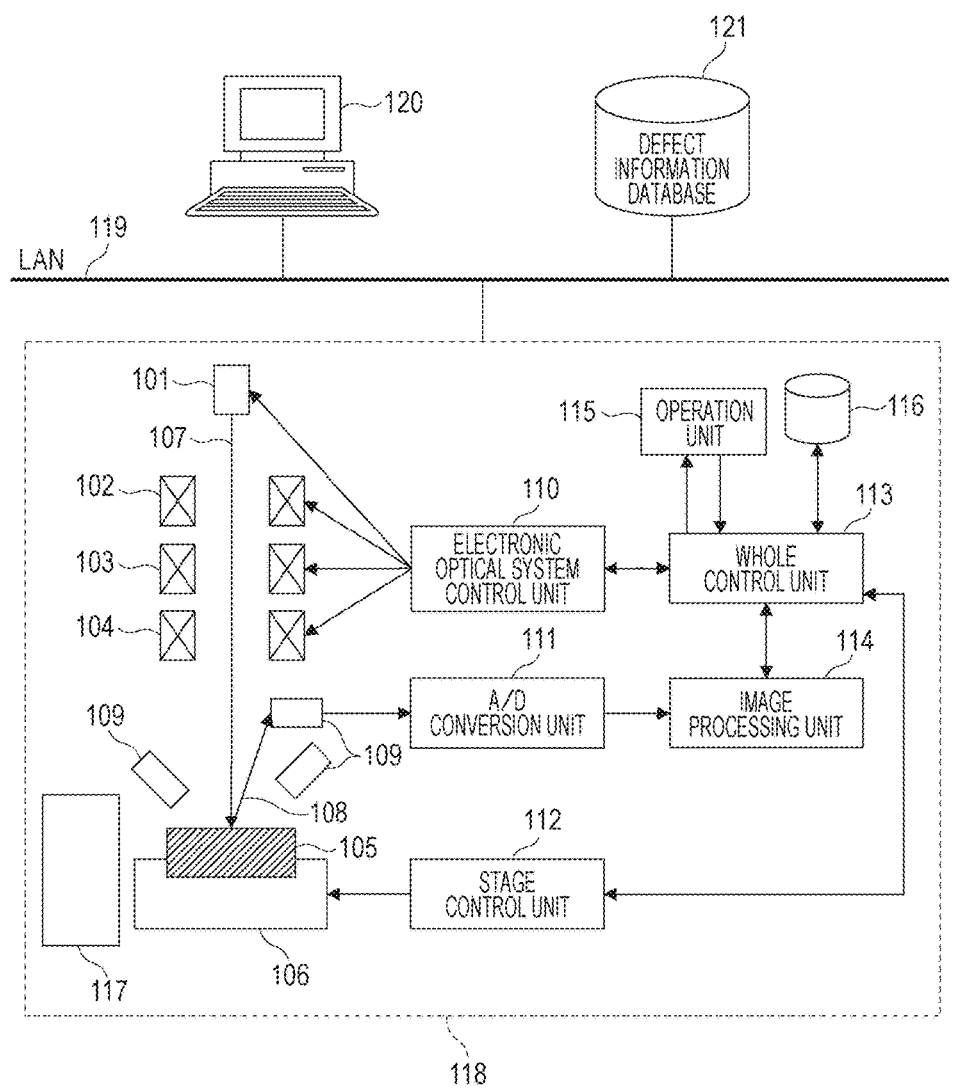
FIG. 1 is a schematic diagram illustrating an entire configuration of a defect image classification system.

Hereinafter, configuration examples of a defect image classification device and a defect image classification system for realizing improvement of efficiency of MDC work will be described with reference to the accompanying drawings. The defect image classification system to be described below is an example of the present invention. Therefore, the present invention is not limited to the embodiments to be described below.

In the present specification, the "defect image classification device" widely includes devices that acquire images of a sample using a charged particle beam mainly and classify the acquired images for each defect kind. The "defect image classification system" widely includes systems in which the defect image classification device is connected to other device via a network and which are configured to include the defect image classification device.

As a configuration example of the defect image classification system including the defect image classification device, an example of the case in which defect images are acquired by an SEM-type defect observation device and the acquired defect images are classified by the defect image classification device will be described. However, a system configuration is not limited thereto and a portion or all of devices configuring the defect image classification system may be configured using different devices. For example, the defect image classification device according to this embodiment is connected to the SEM-type defect observation device via the network. However, processing in the defect image classification device may be incorporated into the SEM-type defect observation device. For example, operation processing to be described below may be executed by a defect image classification processing unit incorporated into the SEM-type defect observation device. In addition, the operation processing to be described below may be executed by a dedicated substrate. In addition, a program for executing the operation processing to be described below may be executed by a central processing unit (CPU) of system configuring elements.

In the present specification, the "defects" mean all defects that affect a yield of a resultant of a manufacturing process. For example, the "defects" are not limited to foreign materials and widely include observation object materials such as a material defect or a manufacturing defect of a sample and a shape change or a brightness change of a manufacturing pattern.

In addition, the "defect images" mean images becoming defect observation objects and include defect candidate images or pseudo defect images as well as genuine defect images.

In addition, a "reference image" is a standard image used for comparison with the defect images to extract the defects and shows an image of a normal region, that is, a region estimated as a region where there is no defect. Furthermore, because portions expressed as a "high-magnification image" and a "low-magnification image" often have relatively "high magnification" and "low magnification", respectively, the portions are expressed as the "high magnification" and the "low magnification" as a representative example and the "high magnification" and the "low magnification" do not express absolute magnifications. The magnifications of the "high magnification" and the "low magnification" may be reversed, but this is a rare example.

In addition, "feature amounts" are information showing defectiveness. The feature amounts include information showing a feature of a detection signal obtained from a detection system to be described below and information showing a feature obtained by executing predetermined processing (for example, image processing, calculation processing, and statistical processing) on the detection signal. As an example of the feature amounts, there are feature amounts obtained by digitizing an uneven state of the defect, a shape, and brightness (brightness information). As the feature amounts, there are a feature amount by quantifying a background pattern as well as a defect region and a feature amount obtained by quantifying a position relation of the defect region and the background pattern.

First Embodiment

An SEM-type defect observation device is a device that acquires a high-definition SEM image of the defect coordinates under conditions suitable for observation or analysis, using the defect coordinates detected by a defect inspection device such as optical and SEM-type inspection devices as input information. In addition to the defect coordinates detected by the defect inspection device, coordinate information of observation points extracted by a simulation based on design layout data can be used as the input information of the SEM-type defect observation device.

FIG. 1 is a schematic diagram illustrating an entire configuration of a defect image classification system according to this embodiment. An SEM-type defect observation device 118 includes an electronic optical system that includes an electron gun 101, lenses 102, scanning deflectors 103, objective lenses 104, a sample 105, and a plurality of secondary particle detectors 109. A charged particle beam optical system (here, the electronic optical system) may include other lens, an electrode, and a detector in addition to the above components, some components of the charged particle beam optical system may be different from the above components, and the configuration of the charged particle beam optical system is not limited thereto.

The SEM-type defect observation device 118 further includes a stage 106 that moves a sample stand holding the sample 105 to be observed in an XY plane, an electronic optical system control unit 110 that controls various optical elements included in the electronic optical system, an A/D conversion unit 111 that quantizes an output signal of the secondary particle detector 109, and a stage control unit 112 that controls the stage 106. The SEM-type defect observation device 118 may further include an optical microscope 117 that functions as an upper defect inspection device.

The SEM-type defect observation device 118 further includes a whole control unit 113, an image processing unit 114, an operation unit 115, and a storage device 116. The operation unit 115 includes a display (display unit), a keyboard, and a mouse. An image acquired by an SEM is stored in the storage device 116.

In the SEM-type defect observation device 118, a primary electron beam 107 emitted from the electron gun 101 is converged by the lens 102 and is deflected by the scanning deflector 103. After the primary electron beam 107 is deflected by the scanning deflector 103, the primary electron beam 107 is converged by the objective lens 104 and is emitted to the sample 105.

From the sample 105 to which the primary electron beam 107 has been emitted, a secondary particle 108 such as a secondary electron and a reflection electron is generated according to a shape or a material of the sample 105. After the generated secondary particle 108 is detected by the secondary particle detector 109, the secondary particle 108 is converted into a digital signal by the A/D conversion unit 111. An output signal of the secondary particle detector 109 converted into the digital signal may be called an image signal.

The output signal of the A/D conversion unit 111 is output to the image processing unit 114 and the image processing unit 114 forms an SEM image. The image processing unit 114 acquires images corresponding to the plurality of secondary particle detectors 109, on the basis of signals obtained by detecting the secondary particle 108 by the plurality of secondary particle detectors 109. FIG. 1 illustrates the three secondary particle detectors 109. However, in the present specification, an SEM-type defect observation device having five secondary detectors is also used for description.

The control of the electronic optical system including the lens 102, the scanning deflector 103, and the objective lens 104 is executed by the electronic optical system control unit 110. In addition, position control of the sample 105 is executed by the stage 106 controlled by the stage control unit 112. The whole control unit 113 is a control unit that wholly controls the SEM-type defect observation device. The whole control unit 113 may be configured using an information processing device such as a computer. For example, the whole control unit 113 includes a CPU and a memory. The whole control unit 113 includes an interface with the operation unit 115 and the storage device 116 and the whole control unit 113 processes information input from the operation unit 115 and the storage device 116 and controls the electronic optical system control unit 110, the stage control unit 112, and the image processing unit 114. The whole control unit 113 outputs a processing result to the display unit included in the operation unit 115 or the storage device 116, if necessary.

The image processing unit 114 can execute various image processing such as ADR processing for executing image processing such as defect detection, using the generated SEM image, and ADC processing for automatically classifying defects for each defect kind, on the basis of an image acquired by the ADR processing. In this embodiment, the image processing unit 114 executes the ADR processing and the defect image classification device 120 connected to the SEM-type defect observation device 118 via the network executes the ADC processing. The defect image classification device 120 is configured using an information processing device such as a computer. For example, the defect image classification device 120 includes a CPU, a memory, a display unit (display), and an input unit (a keyboard and a mouse). The processing executed by the defect image classification device 120 can be realized by software and can be realized by executing a program of desired operation processing by the CPU. Hereinafter, a part or all of functional blocks of the defect image classification device 120 may also be called a "control unit".

The processing executed by the image processing unit 114 may be realized as hardware by a dedicated circuit board. When the processing is configured using the hardware, the processing can be realized by integrating a plurality of operators executing the processing into a wiring substrate, a semiconductor chip, or a package.

In addition, the processing executed by the image processing unit 114 may be realized by software executed by a computer connected to the SEM-type defect observation device 118. When the processing is configured using the software, the computer has a high-speed CPU mounted thereon and the CPU executes a program corresponding to desired operation processing (processing corresponding to the image processing unit 114).

FIG. 1 illustrates an example of the case in which the SEM-type defect observation device 118, the defect image classification device 120, and the defect information database 121 are network-connected via a local area network (LAN) 119, as an example of the defect image classification system. In this example, an image acquired by the SEM-type defect observation device 118 is stored in the defect information database 121. In addition, information (for example, defect information output by the upper defect inspection device, acquisition conditions of a defect image, and the detected defect coordinates) regarding a defect as well as the defect image is stored in the defect information database 121. A recipe describing execution conditions of the ADR is also stored in the defect information database 121.

The defect classification object image has been described as the SEM image. However, in the case of the SEM-type defect observation device 118 having the optical microscope 117 mounted thereon as the component, an optical microscope image as well as the SEM image becomes a defect classification object image.

Figure 2A:
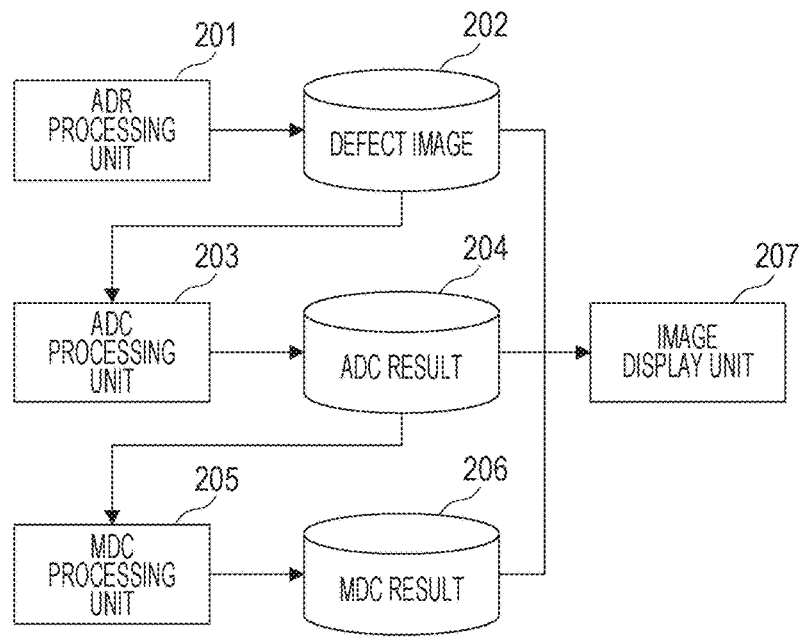
FIG. 2A is a diagram illustrating a relation of an ADR processing unit, an ADC processing unit, and an MDC processing unit.

FIG. 2A is a diagram illustrating a relation of an ADR processing unit, an ADC processing unit, and an MDC processing unit. In this example, the image processing unit 114 of FIG. 1 includes an ADR processing unit 201. In addition, the defect image classification device 120 of FIG. 1 includes an ADC processing unit 203, an MDC processing unit 205, and an image display unit 207. For example, the image display unit 207 corresponds to the display unit (the display) of the defect image classification device 120. A defect image 202, an ADC result 204, and an MDC result 206 are stored in the defect information database 121 of FIG. 1. Here, an example of the case in which the ADR processing is executed by the CPU mounted on the whole control unit 113 of FIG. 1 and the ADC processing and the MDC processing are executed by the CPU mounted on the defect image classification device 120 of FIG. 1 is described. However, the present invention is not limited thereto.

First, the ADR processing unit 201 executes automatic defect detection processing (ADR processing) using the defect coordinate information detected by the upper defect inspection device (here, the optical microscope 117) and acquires a defect image. The defect image acquired by the ADR processing unit 201 is stored as the defect image 202 in the defect information database 121. Here, the defect image 202 includes a reference image acquired by the ADR processing unit 201, an intermediate image generated in the course of the ADR processing, and information such as effectiveness of each image kind in the defect detection processing, in addition to the defect image.

Next, the ADC processing unit 203 executes the automatic defect classification processing (ADC processing) using the defect image 202 as input information and automatically classifies kinds of defects included in the defect image 202, on the basis of the defect image 202. A classification result of the defects is stored as the ADC result 204 in the defect information database 121. At this time, the ADC result 204 may also include an intermediate image generated in the course of the ADC processing and information such as effectiveness of each image kind in the defect classification processing, in addition to the defect kinds to be the classification result.

Next, the MDC processing unit 205 displays the defect image 202 on the image display unit 207, for each defect kind, on the basis of the ADC result 204. The MDC processing unit 205 urges a user to confirm the defect image 202 (confirm the defect image classification result) displayed for each defect kind. The user confirms and modifies the defect image classification result on the image display unit 207. When there is no error in the defect image classification result, the user determines the defect image classification result on a screen. When there is no modification in the defect image classification result, the MDC processing unit 205 stores the defect image classification result as the MDC result 206. Meanwhile, when there is the error in the defect image classification result, the user modifies the defect image classification result on the screen. The MDC processing unit 205 acquires modification content input via the input unit of the defect image classification device 120 and stores a modified classification result as the MDC result 206. A confirmation result and a modification result of the defect image classification result are stored as the MDC result 206 in the defect information database 121. At this time, the MDC result 206 may also include information such as a kind of a display image when the user determines the defect kind, in addition to the defect kind to be the classification result.

Figure 2B:
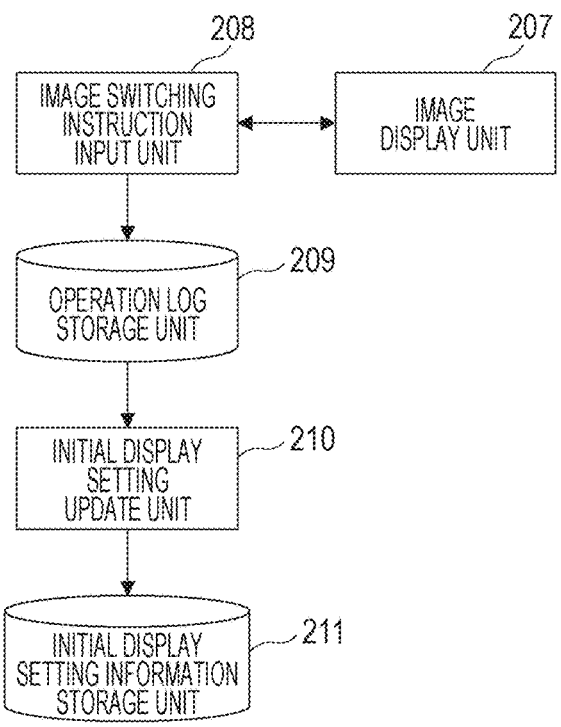
FIG. 2B is a diagram illustrating functional blocks associated with image display of a defect image classification device.

FIG. 2B is a diagram illustrating functional blocks for the image display of the defect image classification device 120. The defect image classification device 120 includes an image switching instruction input unit 208, an operation log storage unit 209, an initial display setting update unit 210, and an initial display setting information storage unit 211.

The image switching instruction input unit 208 receives an input of the user that shows switching an image displayed on the image display unit 207 into an image obtained by the different secondary particle detector 109 at the same time as the image acquisition. Here, the input of the user is performed via an interface on the screen of the image display unit 207, using the input unit (the keyboard and the mouse). For example, an image obtained by a first detector of the plurality of secondary particle detectors 109 is displayed on the image display unit 207. If the image switching instruction input unit 208 receives the input of the user, the image switching instruction input unit 208 can switch the image into an image obtained by a second detector of the plurality of secondary particle detectors 109. In this embodiment, because the five secondary particle detectors are used, switching can be executed between images obtained by the five detectors.

The image switching instruction input unit 208 stores a switching operation log of the user for the image switching instruction input unit 208 in the operation log storage unit 209. Here, the "switching operation log" is a display history of images displayed on the image display unit 207 while the MDC work is performed. The switching operation log includes at least information of an image kind of a final image when the defect kind is determined in the MDC work. This is because the image kind of the final image when the defect kind is determined can be considered as an image kind suitable for specifying the defect kind. When an initially displayed image kind is appropriate, the user determines the defect kind without switching the screen. At this time, the initially displayed image kind is recorded as the image kind of the final image when the defect kind is determined. In actuality, the user may determine the defect kind after viewing a plurality of kinds of images. Therefore, the switching operation log may include a plurality of image switching histories until the defect kind is determined in the MDC work.

The initial display setting update unit 210 calculates the appearance frequency of the image kind when the defect kind is determined in the MDC work, on the basis of the switching operation log stored in the operation log storage unit 209. In the MDC work, there are both cases of (1) when an image of a certain image kind is viewed, the classification result of the ADC is determined without a modification, because the classification result is right, and (2) when the image of the certain image kind is viewed, the classification result of the ADC is modified because there is the error in the classification result. Here, both the cases of (1) and (2) are counted for the "appearance frequency of the image kind when the defect kind is determined".

The initial display setting update unit 210 associates the kind of the defect and a kind of an image displayed initially on the image display unit 207, using the information of the appearance frequency, and stores association information in the initial display setting information storage unit 211. As a result, the MDC processing unit 205 can read information of the image kind of the initial display set for each defect kind from the initial display setting information storage unit 211 and display an image of the image kind as the initial display on the screen. In this example, the "initially displayed image" means an image displayed first when the defect kind is selected in the MDC. Therefore, when other defect kind is selected after the MDC ends with respect to a certain defect kind, an image displayed first at that time also corresponds to the "initially displayed image".

In this embodiment, defect images are classified for each defect kind by the ADC and the MDC work is performed using a classification result of the ADC. When the MDC work is performed, the user selects a defect kind, reads an image, and displays a defect image on the screen. In this embodiment, on the basis of a switching operation log when the user classifies an image of a defect determined previously as the same kind as the kind determined by the ADC processing unit 203, the initial display setting update unit 210 associates the kind of the defect and the kind of the image displayed initially on the display unit. Therefore, the image (initially displayed image) displayed when the defect kind is selected and the image is read can be displayed with an optimal image kind, on the basis of the previous switching operation log, and improvement of efficiency of the MDC work can be realized.

In this embodiment, effectiveness of each image kind in the defect detection processing, included in the defect image 202 to be the output of the ADR processing unit 201, effectiveness of each image kind in the defect classification processing, included in the ADC result 204 to be the output of the ADC processing unit 203, and a kind of a display image at the time of determining a defect kind, included in the MDC result 206 to be the output of the MDC processing unit 205, are important. Therefore, detailed description thereof is given below.

FIG. 3 is a schematic diagram illustrating a basic concept of the defect detection processing in the ADR. In a defect detection processing algorithm in the ADR, there are a plurality of methods. Here, effectiveness of each image kind in the defect detection processing is described using a method of extracting a defect region from a difference of the defect image and the reference image. However, the present invention is not limited to the above method. A method of combining the defect image and an image corresponding to the reference image and extracting the defect region from the difference of the defect image and the reference image or a method of generating the reference image from design data may be used.

Here, a defect in which it is easy to recognize the defect in an image 301 from a detector of an upward direction in the SEM-type defect observation device including the five kinds of secondary particle detectors, but it is difficult to recognize the defect in images 302, 303, 304, and 305 from detectors of four directions, for example, a defect called a voltage contrast (VC) defect is described as an example.

First, images acquired by the detector of the upward direction affected by a material quality or an electrification characteristic of a sample called material contrast among the five kinds of detectors are expressed as "Top images" hereinafter. In FIG. 3, a defect image 301 and a reference image 306 correspond to the Top images.

Next, images acquired by the detectors of the four directions affected by an uneven shape of the sample are expressed as "North images", "East images", "South images", and "West images", according to the directions of the detectors. In FIG. 3, a defect image 302 and a reference image 307 correspond to the North images, a defect image 303 and a reference image 308 correspond to the East images, a defect image 304 and a reference image 309 correspond to the South images, and a defect image 305 and a reference image 310 correspond to the West images. In addition, the images acquired by the detectors of the four directions may be collectively called "NEWS images".

In the defect detection processing in the ADR, difference images (311 to 315) of the defect images (301 to 305) and the reference images (306 to 310) are generated. In FIG. 3, a difference image of the Top images is expressed as 311, a difference image of the North images is expressed as 312, a difference image of the East images is expressed as 313, a difference image of the South images is expressed as 314, and a difference image of the West images is expressed as 315. Here, a region where a difference is most notable is extracted as the defect region. Generally, in a gray-scale SEM image, the magnitude of the difference is often defined by a difference value of pixels in which it is determined that there is a difference and the number of pixels in which it is determined that there is the difference. In actual ADR processing, alignment processing of a defect image and a reference image, nose removal processing, combination processing of various images, majority decision processing, and threshold processing for a brightness value of a difference image are executed. In FIG. 3, the threshold processing is executed on the difference value, pixels in which there is a difference more than a threshold are displayed by white, pixels in which there is a difference equal to or less than the threshold are displayed by black, and binarization is performed. Although not described in detail herein, the present invention is not limited to a specific defect detection algorithm.

In an example of FIG. 3, because a difference region in the difference image 311 is largest, a region displayed with a white color in the difference image 311 is extracted as the defect region. At this time, a most effective image kind becomes the Top image by the defect detection process in the ADR.

Likewise, in the ADC, a shape and brightness information of the region detected as the defect region are quantified as feature amounts and defects are classified for each defect kind from a space distribution of the feature amounts. As the feature amounts used for the ADC processing, there are multiple feature amounts such as a feature amount obtained by quantifying a background pattern and a feature amount obtained by quantifying a position relation of the defect region and the background pattern, in addition to the feature amount for the defect region. For feature amount calculation processing, there are a wider variety of processing than the processing in the ADR. Although not described in detail herein, the present invention is not limited to a specific defect classification algorithm and a most effective image kind can be specified by the defect classification processing.

FIG. 4 is a schematic diagram illustrating a concept of extracting a display image at the time of determining a defect kind in the MDC. The image display unit 207 displays automatically classified defect kinds and images used for the automatic classification.

A defect kind in this example is a VC defect and it is easy to recognize a defect in the Top image acquired by the Top detector rather than the NEWS image. Therefore, first, when a West image 401 is displayed on the image display unit 207, the user switches the West image 401 into a Top image 402 via the interface on the screen to determine the defect kind.

As a result, the user can recognize the defect while viewing the Top image 402 in which it is easy to specify the VC defect and can determine the defect kind. In the case of this example, the "Top image" becomes an image kind of a final image when the defect kind is determined in the MDC work.

In this embodiment, the switching operation log (switching history) of the display image is stored. The switching operation log of the display image at the time of determining the defect kind is stored in the operation log storage unit 209 of FIG. 2B. The switching operation log may be stored in the defect information database 121 together with the MDC result 206 of FIG. 2A. The image switching instruction input unit 208 stores the switching operation log in the operation log storage unit 209, so that the MDC processing unit 205 can select an initial display image when the same defect kind is determined in the following MDC processing. For example, as illustrated in FIG. 4, when an image is displayed by selecting the VC defect in the following MDC processing, the Top image can be initially displayed (403).

In addition, an image kind suitable for determining a defect kind is different for each defect kind. Therefore, it is important to associate a defect kind and a kind of a display image with each other. Information in which the defect kind and the kind of the initial display image are associated with each other is stored in the initial display setting information storage unit 211. In this example, information in which the VC defect and the Top image are associated with each other is stored in the initial display setting information storage unit 211. The MDC processing unit 205 refers to the information of the initial display setting information storage unit 211, selects the Top image as the initial display when the VC defect is specified, and displays the Top image on the image display unit 207. As a result, because the user can determine the defect kind without switching the display image, efficiency of the MDC work can be improved.

Figure 5A:
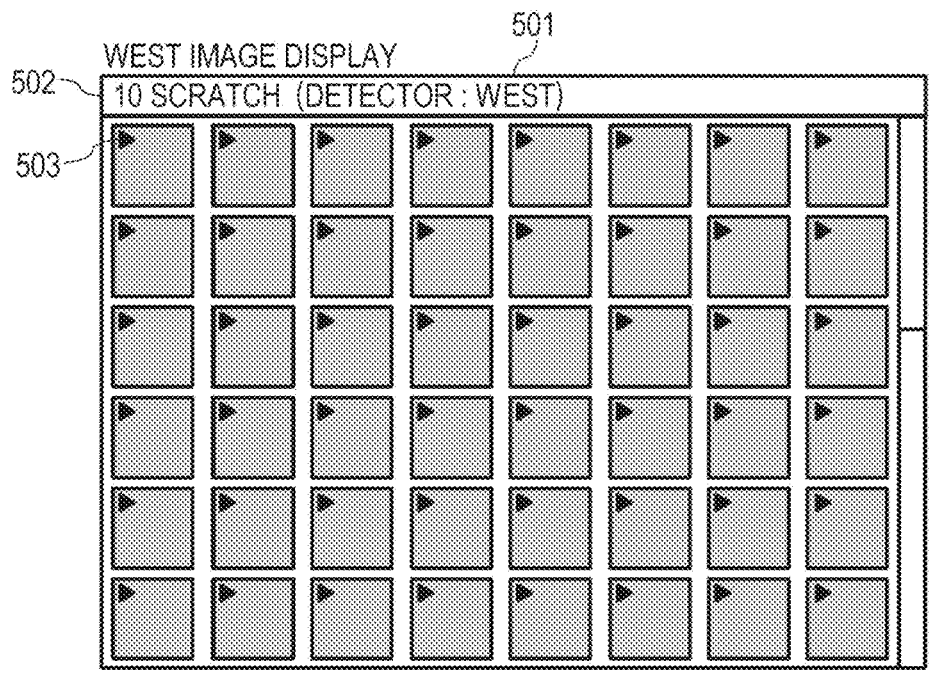
FIG. 5A is a diagram illustrating an example of a GUI in the case in which a display image is switched in the MDC.
Figure 5B:
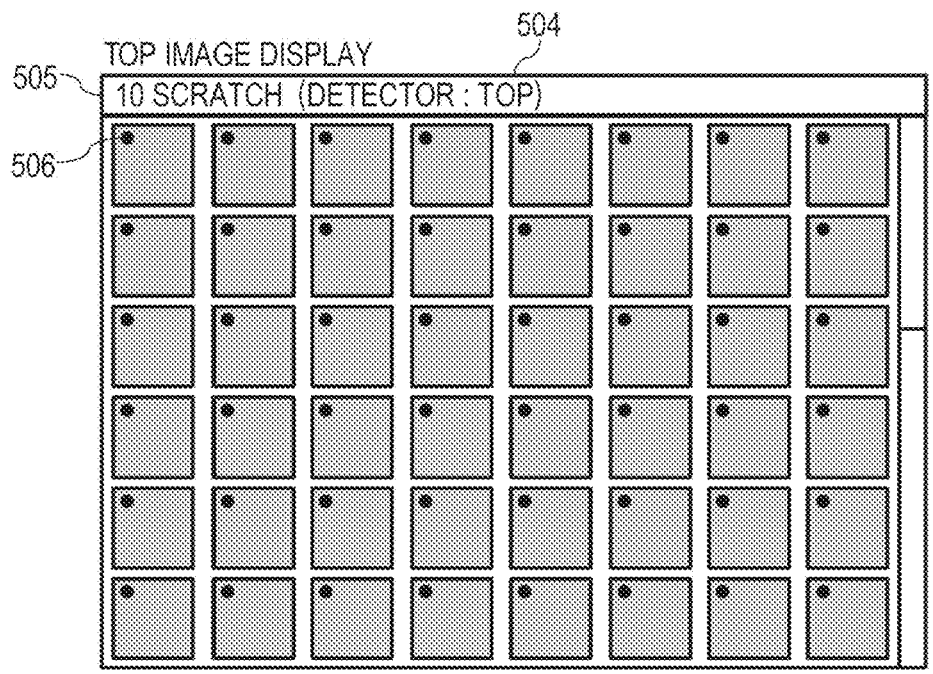
FIG. 5B is a diagram illustrating an example of a GUI in the case in which a display image is switched in the MDC.

FIGS. 5A and 5B illustrate an example of a GUI in the case in which the display image is switched in the MDC corresponding to FIG. 4. For example, for multiple observation points of a semiconductor wafer to be observed, images of the observation points classified into a specific defect kind are displayed in a form of a list for each kind of the detectors.

In this example, West image display 501 of FIG. 5A is displayed as the initial display on the image display unit 207. In the GUI for the MDC work, images are preferably displayed in a form of a list for each defect kind, on the basis of the ADC result. This is because work efficiency is superior in the case in which an image of a heterogeneous defect kind classified erroneously by the ADC is extracted from a list of defect images for the plurality of observation points and is modified rather than the case in which the defects are confirmed individually (for each observation point). For this reason, images of the plurality of observation points classified into a defect kind "10 Scratch" are displayed in a form of a list in the West image display 501. In addition, the defect kind "10 Scratch" and a detector "Detector: West" are displayed as a window title 502 in the West image display 501. Because "10" in the defect kind is called a classification code of the ADC, a code corresponding to the defect kind is allocated.

In addition, a system in which collective display switching is enabled for each defect kind and an image kind corresponding to a detector can be switched and displayed in a selection image unit may be used. In the system, it is preferable to display identification information 503 of a display image kind in an image unit, in addition to the window title. Here, a kind of a display image is expressed using the identification information 503 corresponding to the West image.

The user switches image display from the West image display 501 of FIG. 5A to the Top image display 504 of FIG. 5B. According to switching of the display image, a window title 505 and identification information 506 of a display image kind are also switched. As such, the defect kind of the display image and the image kind are displayed, so that the user can specify an image of a heterogeneous defect kind easily and modify the image.

As a method of modifying the defect kind, there are a method of displaying a list of defect kinds by a right mouse click and selecting a defect kind after modification, in a state in which one or more images to be modified are selected, and a method of displaying a list of defect kinds on a GUI and moving a selected image by a drag-and-drop operation. In the case of a screen corresponding to a touch panel, an image to be modified may be moved by a swipe operation. In addition, completion of modification processing may be shown explicitly by pressing a completion button. As such, there are various methods as the method of modifying the defect kind and the method of modifying the defect kind is not limited to the above methods.

Figure 6A:
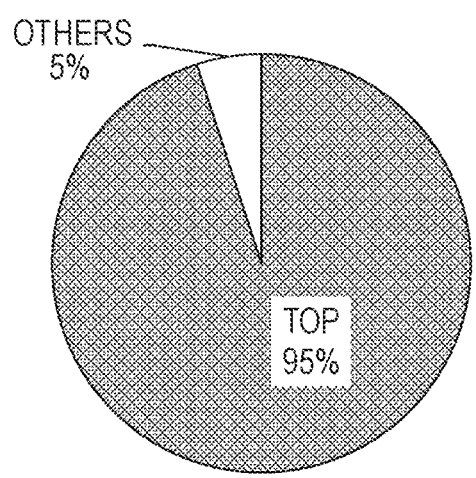
FIG. 6A is a diagram illustrating an example of the appearance frequency of a display image at the time of determining a defect kind in the MDC and an example of the case in which the number of kinds of frequently appearing images is one.

FIG. 6A illustrates an example of the case in which the appearance frequency of a display image when a defect kind is determined in the MDC is shown by a circular graph. The circular graph is a result that is calculated by the initial display setting update unit 210, on the basis of the switching operation log of the screen display of FIGS. 4, 5A, and 5B. FIG. 6A illustrates the case in which the number of frequently appearing image kinds is one and the Top image is used most frequently when a defect kind is determined.

As such, when an image kind when a defect kind is determined is only a certain kind (that is, one kind), an initial display image is set to a most frequently appearing image kind (Top image). As a result, when the same defect kind is determined thereafter, an operation for switching a displayed image kind can be greatly reduced. Therefore, efficiency of the MDC work can be improved.

Figure 7:
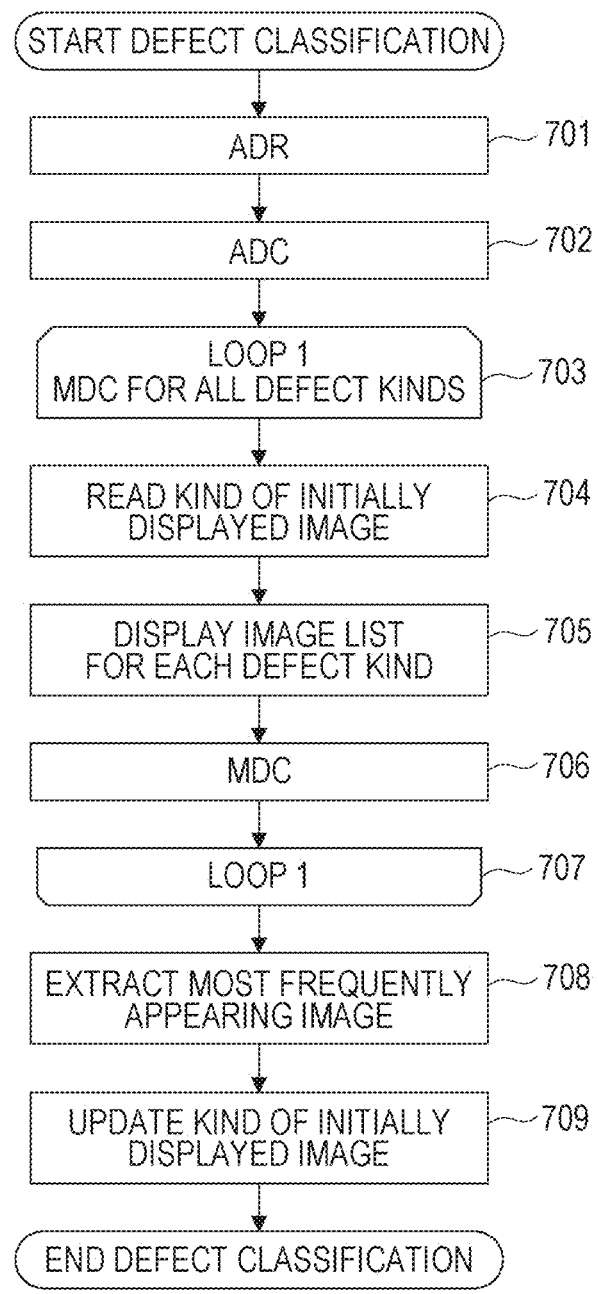
FIG. 7 is a diagram illustrating an example of a flowchart of defect image classification processing.

FIG. 7 is a flowchart illustrating the defect image classification processing in this embodiment. In the following description, the functional blocks illustrated in FIGS. 1, 2A, and 2B are described as subjects. However, because the following processing is executed by executing a predetermined program by a processor using a memory, the processor may be described as the subject.

First, the ADR processing unit 201 executes the ADR processing and acquires the defect image 202 (701). Next, the ADC processing unit 203 executes the ADC processing on the defect image 202 acquired by the ADR processing unit 201 and automatically classifies defects for each defect kind (702). The ADC processing unit 203 outputs the ADC result 204. Generally, a classification accuracy rate of the ADC is about 80 to 90%. In the defect image classification system according to this embodiment, the ADC result 204 is confirmed by the MDC, so that desired classification performance is realized (703 to 707).

In confirmation processing by the MDC, the erroneously classified defect image is visually extracted from the images displayed in the form of the list for each defect kind on the basis of the ADC result 204 and the classification result is modified. First, the MDC processing unit 205 reads the kind of the initial display image set for each defect kind from the initial display setting information storage unit 211 (704). As a result, the MDC processing unit 205 selects images of the image kind associated with the kind of the defect to be the classification result of the ADC (that is, images associated with the kind of the defect thereof and obtained from the partial detectors of the plurality secondary particle detectors 109) as the initially displayed images. The kind of the initially displayed images is updated by initial display image update processing (709) to be described below. However, for new data on which the update processing is not executed, the initial display image set by the user, an image exerting a highest effect at the time of the defect detection processing of the ADR, or an image exerting a highest effect on the classification result at the time of the classification processing of the ADC may be displayed initially.

Here, the image exerting a highest effect at the time of the defect detection processing of the ADR means a most effective image at the time of the defect detection processing, among a plurality of kinds of defect images. In the example of FIG. 3, the Top image 301 corresponds to the image exerting a highest effect at the time of the defect detection processing of the ADR. In FIG. 3, the difference images (311 to 315) of the defect images and the reference images are calculated for each defect kind by comparing the plurality of kinds of defect images (301 to 305) and the reference images (306 to 310) and among the plurality of difference images, the difference image 311 of the Top image to be the image kind where the difference region to be the defect region is largest becomes the image exerting a highest effect at the time of the defect detection processing.

In addition, conceptually, the image exerting a highest effect on the classification result at the time of the defect classification processing of the ADC can be extracted in the same way as the image exerting a highest effect at the time of the defect detection processing of the ADR. However, the defect classification processing of the ADC generally becomes complex processing. More specifically, in the case of the defect classification processing of the ADC, the feature amounts are defined and quantified from each of the defect image, the reference image, and the difference image and the defect kind is specified from the distribution of the quantified feature amounts. Therefore, an image kind exerting a highest effect on specifying the defect kind, that is, an image kind effective for calculating a feature amount showing a feature of the defect kind most surely becomes the image exerting a highest effect on the classification result at the time of the defect classification processing of the ADC. In the example of FIG. 3, it is assumed that a feature amount such as a defect size calculated from the difference image is a most effective feature amount. An image from which a maximum defect size is obtained as the feature amount is the difference image 311 of the Top image. Therefore, the image exerting a highest effect on the classification result becomes the Top image 301.

Next, according to the read kind of the initial display image, the MDC processing unit 205 displays a list of defect images 202 corresponding to the kind on the image display unit 207 (705). The user extracts the image erroneously classified by the ADC from the defect images 202 displayed in the form of the list and modifies the classification result (706). At this time, when the user executes switching from an image of a certain kind to an image of a different kind, the image switching instruction input unit 208 stores a switching operation log of the user in the operation log storage unit 209. At least information of an image kind of a final image when the defect kind is determined in the MDC is recorded on the operation log storage unit 209. The MDC processing described herein is repeated until the MDC for all defect kinds ends (a loop of steps 703 to 706).

After the MDC for all of the defect kinds ends, the initial display setting update unit 210 extracts information of a most frequently appearing image kind for each defect kind, from information of image kinds at the time of determining the individual defect kinds, stored in the operation log storage unit 209 (708). Here, it should be noted that the "image kinds at the time of determining the defect kinds" include defect kinds in which it is not necessary to modify the classification result of the ADC, in addition to defect kinds in which the classification result is modified. Finally, the initial display setting update unit 210 displays the extracted image kind of the most frequently appearing image initially and updates the information of the initial display setting information storage unit 211 (709).

According to the first embodiment described above, the switching operation log at the time of executing the MDC is analyzed, the kind of the image used when the defect kind is determined in the MDC is specified, and the kind of the image is set as the following initial display. According to this configuration, the initial display of the defect image at the time of the MDC processing is set to the image kind suitable for the defect classification work, so that efficiency of the MDC work can be improved.

Second Embodiment

In this embodiment, an example of a method of extracting an image and displaying the image, when there are a plurality of effective image kinds, will be described. Because the content of FIGS. 1 to 3 is the same as the content in the first embodiment, description thereof is omitted.

FIG. 8 is a schematic diagram illustrating a concept of extracting a display image at the time of determining a defect kind in an MDC when there are the plurality of effective image kinds. An example of FIG. 8 is different from an example of FIG. 4 in that an image to be extracted is one kind of Top image in FIG. 4 and image kinds to be extracted are plural in FIG. 8.

For example, in the case of a defect kind occurring in the vicinity of a pattern sidewall of a line pattern of a longitudinal direction, if a defect occurs at a right side of the line pattern, it is easy to identify a defect in an East image 802 rather than a West image 801. This is because it is hard to identify a feature of the defect due to the shadow of the line pattern in the West image 801. In contrast, if a defect occurs at the left side of the line pattern, it is easy to identify the defect in the West image 801 rather than the East image 802. As such, when there are the plurality of effective image kinds, all effective images may be displayed as the initial display. In this example, the West image and the East image are arranged and displayed (803).

Figure 6B:
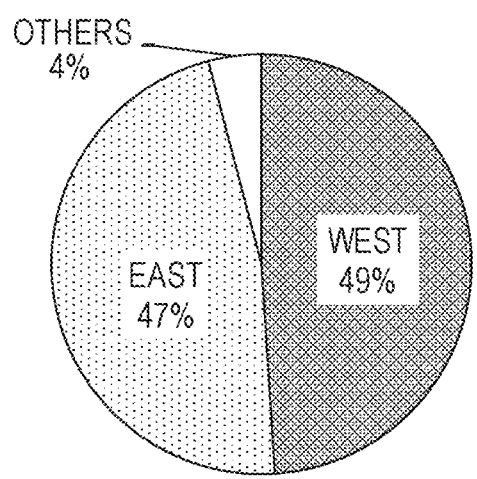
FIG. 6B is a diagram illustrating an example of the appearance frequency of a display image at the time of determining a defect kind in the MDC and an example of the case in which the number of kinds of frequently appearing images is plural.

Here, an example of the case in which there are the plurality of effective image kinds will be described using FIG. 6B. FIG. 6B illustrates an example of the case in which the appearance frequency of a display image when the defect kind is determined in the MDC is shown by a circular graph. The circular graph is a result that is calculated by an initial display setting update unit 210, on the basis of a switching operation log. FIG. 6B illustrates the case in which there are a plurality of frequently appearing image kinds and the West image and the East image are used when a defect kind is determined.

In the case of this example, the switching operation log includes a history showing that a classification result is determined and modified in the West image and a history showing that a classification result is determined and modified in the East image. The initial display setting update unit 210 determines whether image kinds used when a defect kind is determined are two kinds, from information of a switching operation log stored in an operation log storage unit 209. The determination may be performed by determining whether image kinds of which the use frequency is more than a predetermined ratio among image kinds used when the defect kind is determined are two kinds. The initial display setting update unit 210 stores association information of the defect kind and the image kinds of the two kinds in an initial display setting information storage unit 211.

Figure 9A:
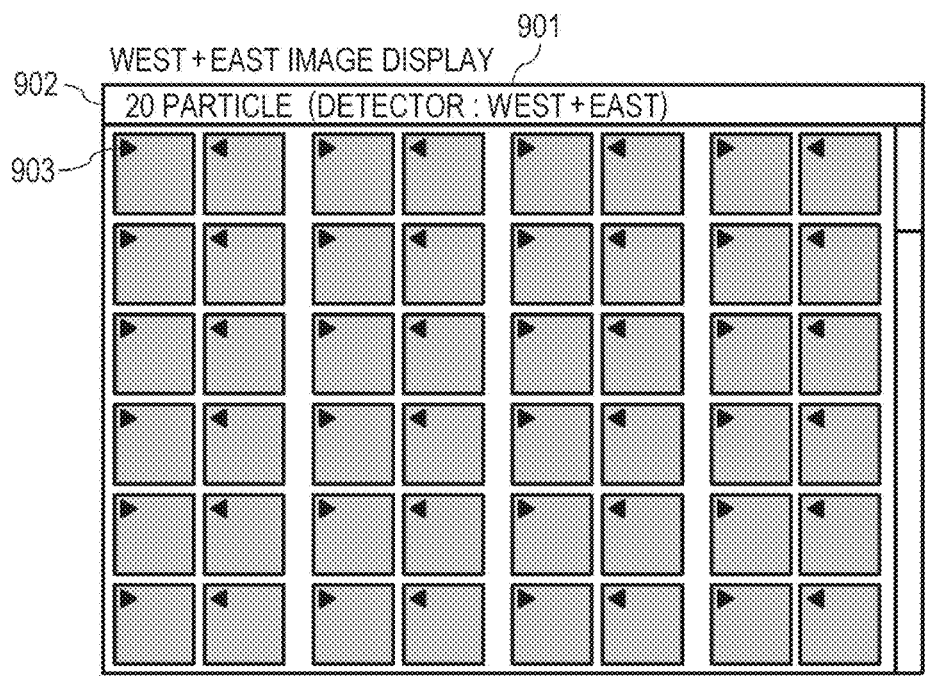
FIG. 9A is a diagram illustrating an example of a GUI in the case in which the number of kinds of images to be displayed initially is two in the MDC.

FIG. 9A illustrates an example of a GUI in the case in which a display image is switched in the MDC corresponding to 803 of FIG. 8. When the image kinds at the time of determining the defect kind are plural like the West image 801 and the East image 802 of FIG. 8, an MDC processing unit 205 may arrange a plurality of kinds of images having the high use frequency and display the plurality of kinds of images on an image display unit 207.

For example, when a defect kind is determined by a combination of a difference in vision in a Top image and a difference in vision in a NEWS image, it is preferable to display a plurality of kinds of images in parallel rather than displaying one combined image in determining the defect kind. In an example in which it is preferable to display the plurality of kinds of images in parallel, because a user confirms the plurality of kinds of defect images, it is important to read a plurality of display image change histories from the switching operation log. For this reason, the switching operation log includes a history of plural hierarchies (a history dating back to the past from determination of a final defect kind), in addition to a history of a final operation.

An example of FIG. 9A is an initial display example when the use frequencies of the West image and the East image are high at the time of determining a defect kind "20 Particle", from the switching operation log. In West+East image display 901, two kinds of images of the West image and the East image are arranged and displayed. The defect kind "20 Particle" and a detector "Detector: West+East" are displayed as a window title 902. Identification information 903 to identify an image kind is displayed at the upper left side of each defect image. In this example, a rightward triangle shows the West image and a leftward triangle shows the East image. The identification information 903 is displayed on an image, so that it can be easily identified that an image is obtained by which detector of a plurality of detectors.

Figure 10:
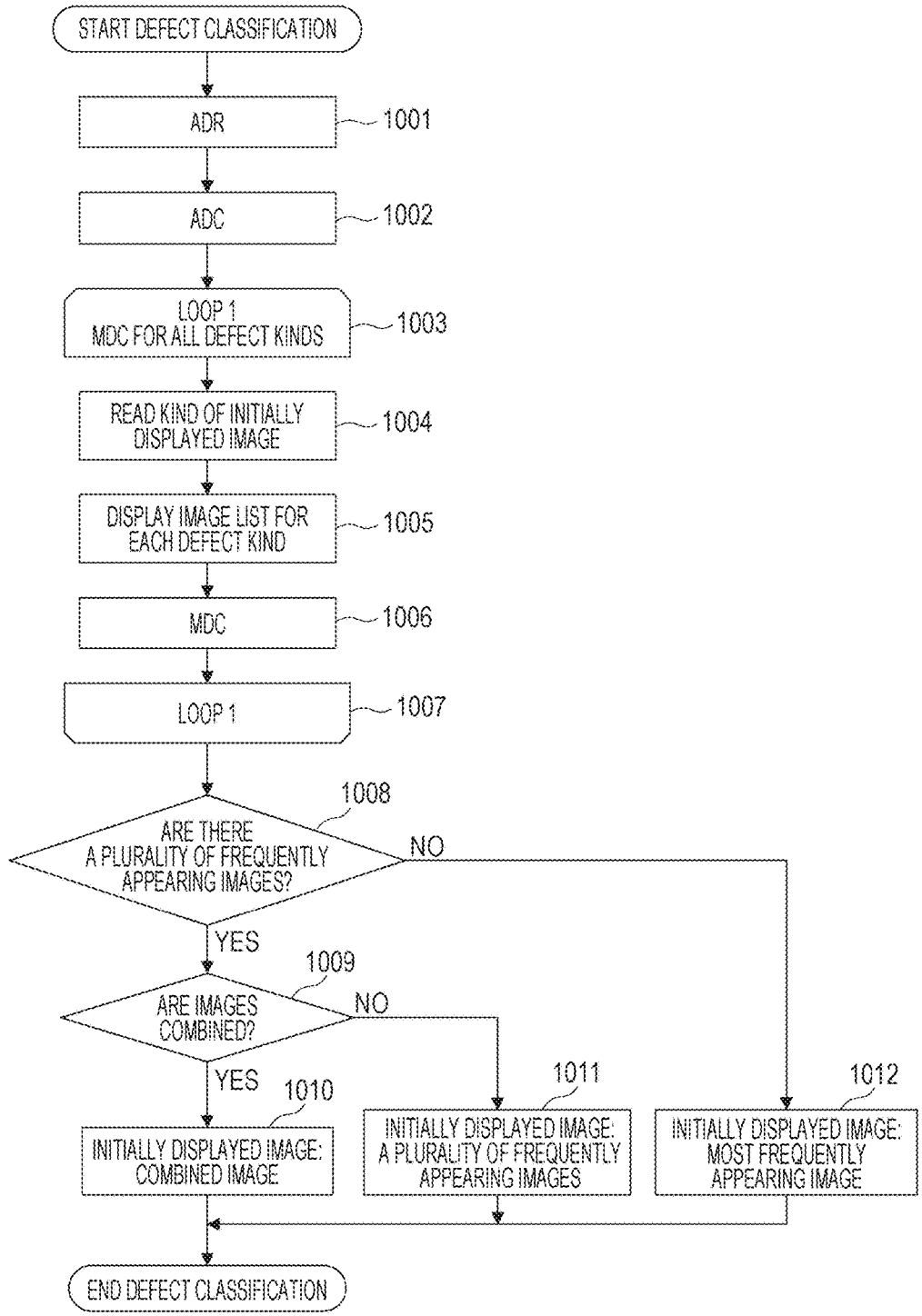
FIG. 10 is a diagram illustrating an example of a flowchart of defect image classification processing.

FIG. 10 illustrates an example of a flowchart of defect image classification processing. FIG. 10 is a flowchart in the case in which a plurality of images or a combined image obtained by combining the plurality of images is selected as an initial display image. An example of the case in which a plurality of images are displayed is described hereinafter and display of the combined image is described in a third embodiment.

Because a flow of FIG. 10 from defect image acquisition by ADR (1001) to defect kind determination by the MDC (1007) is the same as a flow of 701 to 707 of FIG. 7, detailed description thereof is omitted.

The initial display setting update unit 210 analyzes a kind of an image displayed when the defect kind is determined in the MDC, on the basis of the switching operation log, and determines whether there are a plurality of frequently appearing image kinds (1008). For example, when the frequently appearing image kinds when the defect kind is determined in the MDC are plural like FIG. 6B, the initial display setting update unit 210 stores association information of the defect kind and the plurality of image kinds in the initial display setting information storage unit 211 (1011).

When the number of kinds of frequently appearing images when the defect kind is determined in the MDC is one like FIG. 6A, the initial display setting update unit 210 stores association information of the defect kind and an image kind of a most frequently appearing image in the initial display setting information storage unit 211 (1012).

In this example, the configuration in which the image kind to be displayed initially is determined by analyzing the appearance frequency of the display image when the defect kind is determined by the MDC has been described. However, other example may be adopted. As described in the first embodiment, the initial display setting update unit 210 may determine the image kind to be displayed initially, on the basis of the appearance frequency of a most effective image kind by defect detection processing of the ADR and the appearance frequency of a most effective image kind by defect classification processing of the ADC.

In this embodiment, when there are the plurality of kinds of images effective for determining the defect kind, the plurality of images can be arranged and displayed as the initial display of the following MDC. According to this configuration, the user can perform the MDC while referring to the plurality of image kinds suitable for the defect classification work and efficiency of the MDC work can be improved.

Third Embodiment

In this embodiment, an example of an image display method when there are a plurality of effective image kinds will be described. Because content of FIGS. 1 to 9A is the same as the content in the embodiments described above, description thereof is omitted.

In this example, when there are a plurality of image kinds determined as image kinds effective for defect identification, a combined image in which it is easy to identify a defect is generated on the basis of a plurality of images determined as effective images. Here, when the combined image is generated, the images are combined to emphasize features of the plurality of images determined as the effective images for the defect identification. However, the used images are not limited to only the image kinds determined as the effective image kinds. In addition, images other than the image kinds determined as the effective image kinds may be used for the purpose of improving S/N.

First, a basic concept of setting a combined image of a plurality of images to a display image will be described using FIG. 8. Description of 801 to 803 is the same as the description in the second embodiment. In this embodiment, first, a West image and an East image are extracted as effective image kinds (803). Next, a combined image of the West image and the East image is generated (804). The combined image is displayed as initial display in MDC.

Like West+East image display 901 of FIG. 9A, some images effective for defect classification are selected from multiple image kinds, so that work efficiency of the MDC can be improved. However, displayed image kinds are preferably small from the viewpoint of consistency of images. When the displayed image kinds are small, the number of observation points displayed on a screen increases. Therefore, efficiency of determination work of the defect kind by the MDC can be improved.

Figure 9B:
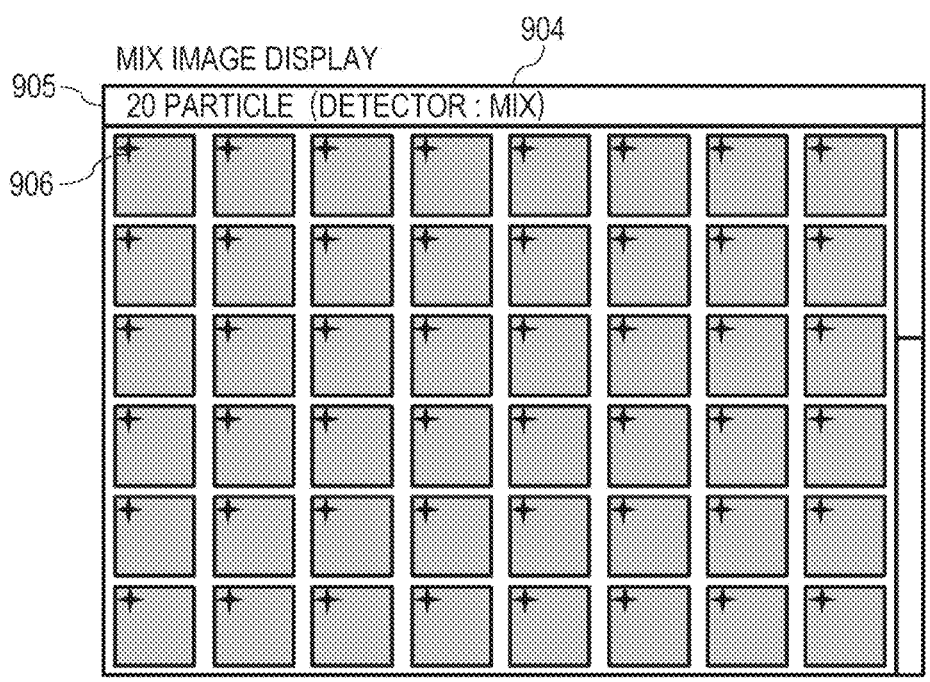
FIG. 9B is a diagram illustrating an example of a GUI to display a combined image of images of two kinds in the case in which the number of kinds of images to be displayed initially is two in the MDC.

FIG. 9B is an initial display example when a display image is switched in the MDC corresponding to 804 of FIG. 8. In Mix image display 904, a combined image of the West image and the East image is displayed. As compared with the West+East image display 901 of FIG. 9A, the number of observation points displayed on a screen is doubled. In a window title 905 to display a kind of a detector, "Detector:

Mix" is displayed to show that a combined image is displayed. In addition, it is preferable to display identification information showing a display image for each image to correspond to switching of the display image for each image. In FIG. 9B, identification information 906 showing the combined image is displayed on the image.

Here, there are various methods as a method of combining images. However, the present invention is not limited by the method of combining the images. For example, the West image and the East image may be combined at the same ratio. However, a combined image of defect images in which defects of observation points are emphasized more can be generated according to the defects of the observation points by increasing a combination ratio of the effective image kinds by the ADR or the ADC. In addition, S/N can be improved by using a North image and a South image as well as combining images effective for defect identification, in this embodiment, only the West image and the East image. A three-dimensional image may be generated from various images. An important thing is to generate a combined image capable of improving efficiency of the defect classification work in the MDC.

Next, a flow for setting a combined image to an initial display image will be described using FIG. 10. Because processes from 1001 to 1007 are the same as the processes in the second embodiment, description thereof is omitted.

An initial display setting update unit 210 analyzes a kind of a defect image displayed when the defect kind is determined in the MDC, on the basis of a switching operation log, and determines whether there are a plurality of frequently appearing image kinds (1008). When there are the plurality of frequently appearing image kinds, the initial display setting update unit 210 determines whether the display image kinds are reduced by the combined image (1009). The determination on whether the image kinds are reduced may be previously set in a defect image classification device 120 and may be designated by a user. When the combined image is generated, the initial display setting update unit 210 stores association information of the defect kind, the plurality of image kinds, and information (for example, a flag) showing generation of the combined image in an initial display setting information storage unit 211 (1010).

Fourth Embodiment

In this embodiment, an example of the case in which grouping for each defect kind is not executed and initial display is performed in a state in which a plurality of defect kinds are mixed will be described. In this example, the "initial display" means first display when MDC starts and display including a plurality of defect kinds of images. This example corresponds to the case in which classification performance of ADC is not high or the case in which the plurality of defect kinds are collectively displayed and MDC work is performed while the plurality of defect kinds are compared. Because content of FIGS. 1 to 10 is the same as the content in the embodiments described above, detailed description thereof is omitted.

Figure 11:
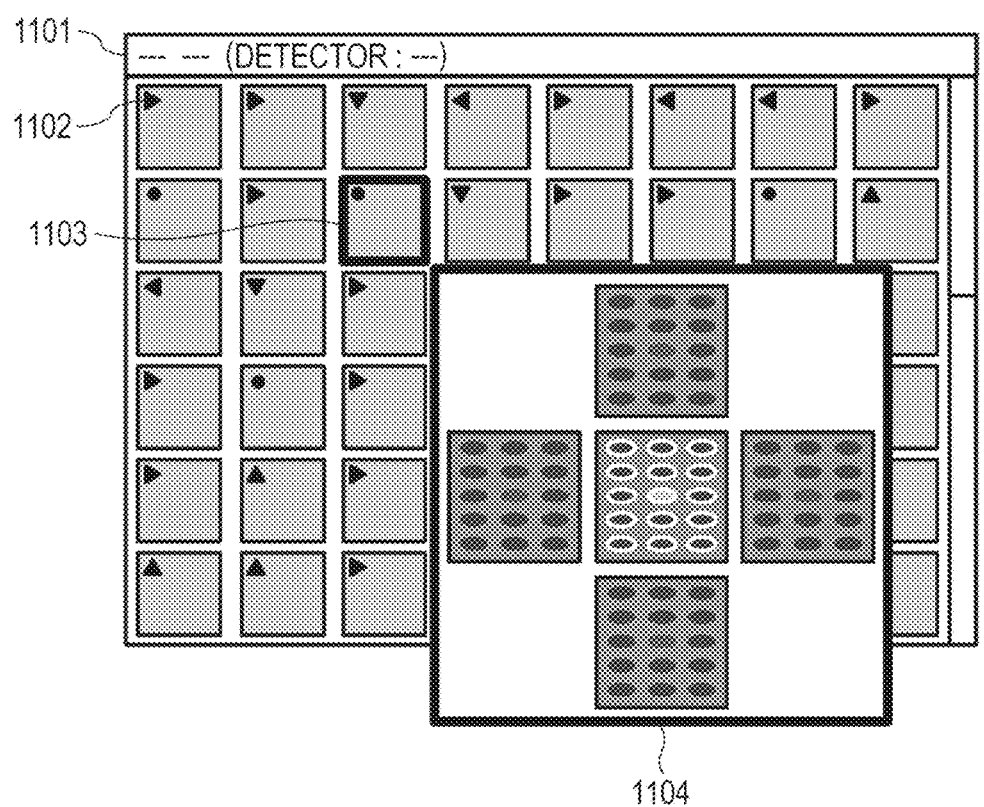
FIG. 11 is a diagram illustrating an example of a GUI to display a plurality of mixed defect kinds in the MDC.

In FIG. 11, instead of list display for each defect kind based on an ADC result, the plurality of defect kinds are collected and are displayed in a form of a list. An image display unit 207 displays the plurality of defect kinds of images in a form of a list as the initial display when the MDC starts. For this reason, a specific defect code, a defect name, and a kind of a detector are not displayed in a window title 1101. However, if an amount of information is an amount of information capable of being displayed in the window title like the case in which two kinds of defect kinds are collected and are displayed in a form of a list, it is preferable to display various information in the window title 1101.

When the plurality of defect kinds are collected and are displayed in a form of a list, a display image kind is determined on the basis of an initial display image kind set according to a defect kind. Therefore, identification information 1102 showing an image kind is different for each defect kind.

When images displayed in a form of a list are selected (1103), which is a function common to the first to fourth embodiments, a sub window 1104 to display other image kind of the selected images may be displayed. As a result, efficiency of the MDC work can be improved. In particular, when there is not accumulation of a switching operation log in the MDC or the accumulation is small, the possibility of an initially displayed image kind being inappropriate becomes high. For this reason, a mechanism for confirming an image of other detector simply is necessary.

As described above, a history of a display image at the time of determining the defect kind by the MDC is analyzed or an image kind effective at the time of defect extraction by ADR or an image kind effective at the time of defect classification processing by the ADC is analyzed, so that an initial display image to be displayed at the time of determining the defect kind by the MDC can be optimized. Specifically, when kinds of images effective for determining the defect kind are one kind, the images thereof are displayed. When kinds of images effective for determining the defect kind are a plurality of kinds, a plurality of images are displayed or a combined image generated on the basis of the plurality of images is displayed. According to the above configuration, work efficiency when the defect kind is determined can be improved.

The present invention is not limited to the embodiments described above and various modifications are included in the present invention. The embodiments are described in detail to facilitate the description of the present invention and are not limited to embodiments in which all of the described configurations are included. In addition, a part of the configurations of the certain embodiment can be replaced by the configurations of another embodiment. In addition, the configurations of another embodiment can be added to the configurations of the certain embodiment. In addition, for a part of the configurations of the individual embodiments, other configurations can be added, removed, and replaced.

In addition, a part or all of the individual configurations, functions, processing units, and processing mechanisms may be designed by integrated circuits and may be realized by hardware. In addition, the individual configurations and functions may be realized by software by analyzing programs for realizing the functions by a processor and executing the programs by the processor. Information such as the programs for realizing the individual functions, tables, and files may be stored in a recording device such as a memory, a hard disk, and a solid state drive (SSD) or a recording medium such as an IC card, an SD card, and an optical disk.

In addition, only control lines or information lines necessary for explanation are illustrated and the control lines or information lines do not mean all control lines or information lines necessary for a product. In actuality, almost all configurations may be connected to each other.

What is claimed is:

1. A defect image classification apparatus comprising:
    an image acquisition unit which acquires images corresponding to a plurality of detectors, on the basis of signals obtained by detecting secondary particles obtained by emitting charged particle beams to a sample by the plurality of detectors;

an automatic defect classification processing unit which automatically classifies kinds of defects included in the images, on the basis of the images;

a display unit which displays the automatically classified kinds of the defects and images used for the automatic classification;

a manual defect classification processing unit which classifies the kinds of the defects included in the images, according to an instruction input by a user, and modifies an automatic classification result;

a control unit which selects images obtained from at least some detectors among the plurality of detectors, associated with the kinds of the defects to be the classification result of the automatic defect classification processing unit, as images displayed initially on the display unit when the instruction is input by the user; and an image switching instruction input unit which receives an input of the user showing switching the images displayed on the display unit into images obtained by other detectors at the same time as acquisition of the images, wherein the control unit calculates an appearance frequency of image kinds at a time of determining a defect kind, on the basis of a switching operation log of the user for the image switching instruction input unit when images of defects determined previously as the same kinds as the kinds of the defects determined by the automatic defect classification processing unit are classified in accordance with an instruction from the user; and the control unit associates the kinds of the defects and the images displayed initially on the display unit, based on the appearance frequency.

2. The defect image classification apparatus according to claim 1, wherein:

the images to be displayed initially are images displayed first when the kinds of the defects are selected to start processing of the manual defect classification processing unit.

3. The defect image classification apparatus according to claim 1, wherein:

the control unit combines the images obtained from some detectors among the plurality of detectors and selects a combined image as the images to be displayed initially.

4. The defect image classification apparatus according to claim 1, wherein:

the control unit displays the images obtained from some detectors among the plurality of detectors as the image to be displayed initially in parallel, on the display unit.

5. The defect image classification apparatus according to claim 1, wherein:

the switching operation log includes at least information of kinds of final images when the kinds of the defects are determined in processing of the manual defect classification processing unit.

6. The defect image classification apparatus according to claim 5, wherein:

the switching operation log includes a plurality of image switching histories until the kinds of the defects are determined in the processing of the manual defect classification processing unit.

7. The defect image classification apparatus according to claim 1, wherein:

the control unit associates the kinds of the defects and the images displayed initially on the display unit, according to the magnitude of an effect on the automatic classification result.

8. The defect image classification apparatus according to claim 1, wherein:

the display unit displays a list of images obtained from some detectors among the plurality of detectors, for each of the kinds of the defects to be the automatic classification result.

9. The defect image classification apparatus according to claim 1, wherein:

the display unit displays a list of a plurality of defect kinds of images when processing of the manual defect classification processing unit starts.

* * * * *